United States Patent [19] [11] 3,993,506
Moon [45] Nov. 23, 1976

[54] PHOTOVOLTAIC CELL EMPLOYING LATTICE MATCHED QUATERNARY PASSIVATING LAYER

[75] Inventor: Ronald L. Moon, Menlo Park, Calif.
[73] Assignee: Varian Associates, Palo Alto, Calif.
[22] Filed: Sept. 25, 1975
[21] Appl. No.: 616,723

[52] U.S. Cl. .................................. 136/89; 357/30; 357/52; 250/211 J
[51] Int. Cl.$^2$ .................. H01L 31/06; H01L 29/34
[58] Field of Search .................. 136/89; 357/30, 52; 250/211 J

[56] References Cited
UNITED STATES PATENTS
3,186,873 6/1965 Dunlap, Jr. ............................ 136/89
3,675,026 7/1972 Woodall ............................ 250/211 J
3,801,509 4/1974 Kurata et al. .................... 252/62.36 A OTHER PUBLICATIONS
H. J. Hovel et al., "Solar Cell Structures," *IBM Technical Disclosure Bulletin*, vol. 16, No. 7, Dec. 1973, pp. 2079–2080.
R. D. Burnham et al., "Al$_x$Ga$_{1-x}$As$_{1-y}$P$_y^1$—GaAs$_{1-y}$P$_y$ Hetero–Structure Laser and Lamp Junctions," *App. Phys. Letters*, vol. 17, No. 10, pp. 455–457 (1970).
R. D. Burnham et al., "Double Heterojunction AlGaAsP Quaternary Lasers," *App. Physics Letters*, vol. 19, No. 2, pp. 25–28 (1971).

*Primary Examiner*—John H. Mack
*Assistant Examiner*—Aaron Weisstuch
*Attorney, Agent, or Firm*—Stanley Z. Cole; Gerald M. Fisher; Robert K. Stoddard

[57] ABSTRACT

A photovoltaic cell has an active portion comprising at least one active layer of a IIIA–VA compound having a p-n junction adjacent an upper surface thereof and an overlying epitaxially grown passivating layer of the quaternary alloy AlGaAsP. The passivating layer has a substantially higher bandgap than the active layer so that it is transparent to photons to which the active layer is sensitive. The lattice constant of this passivating layer can be made the same as that of the active layer, thereby to improve efficiency and device performance by reducing surface recombinations of generated carriers, such that a greater percentage of generated carriers will reach the p-n junction and provide useful output electrical energy. The active portion comprises a GaAs layer covered by an AlGaAsP passivating layer, and the AlGaAsP passivating layer can be lattice matched to the GaAs layer.

10 Claims, 3 Drawing Figures

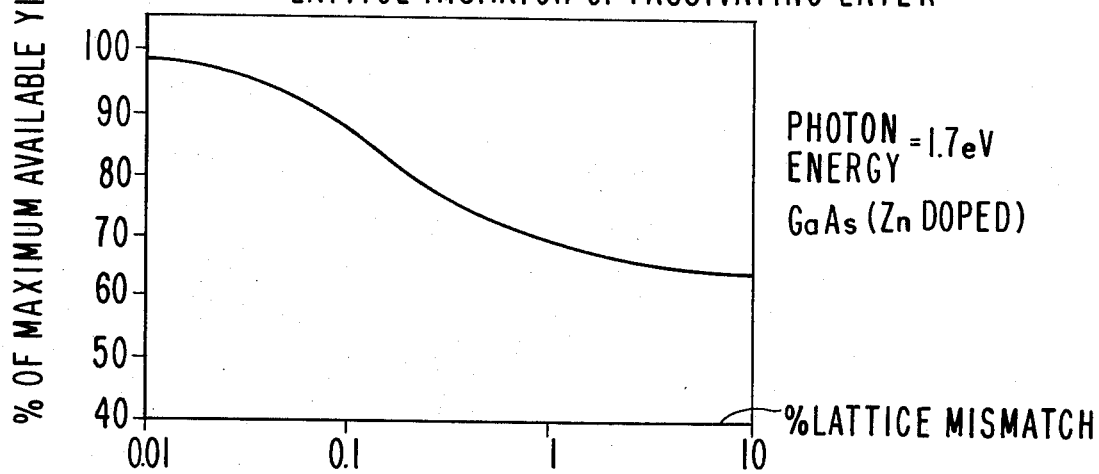
FIG.1 % OF MAXIMUM AVAILABLE CARRIER YIELD V. % LATTICE MISMATCH OF PASSIVATING LAYER
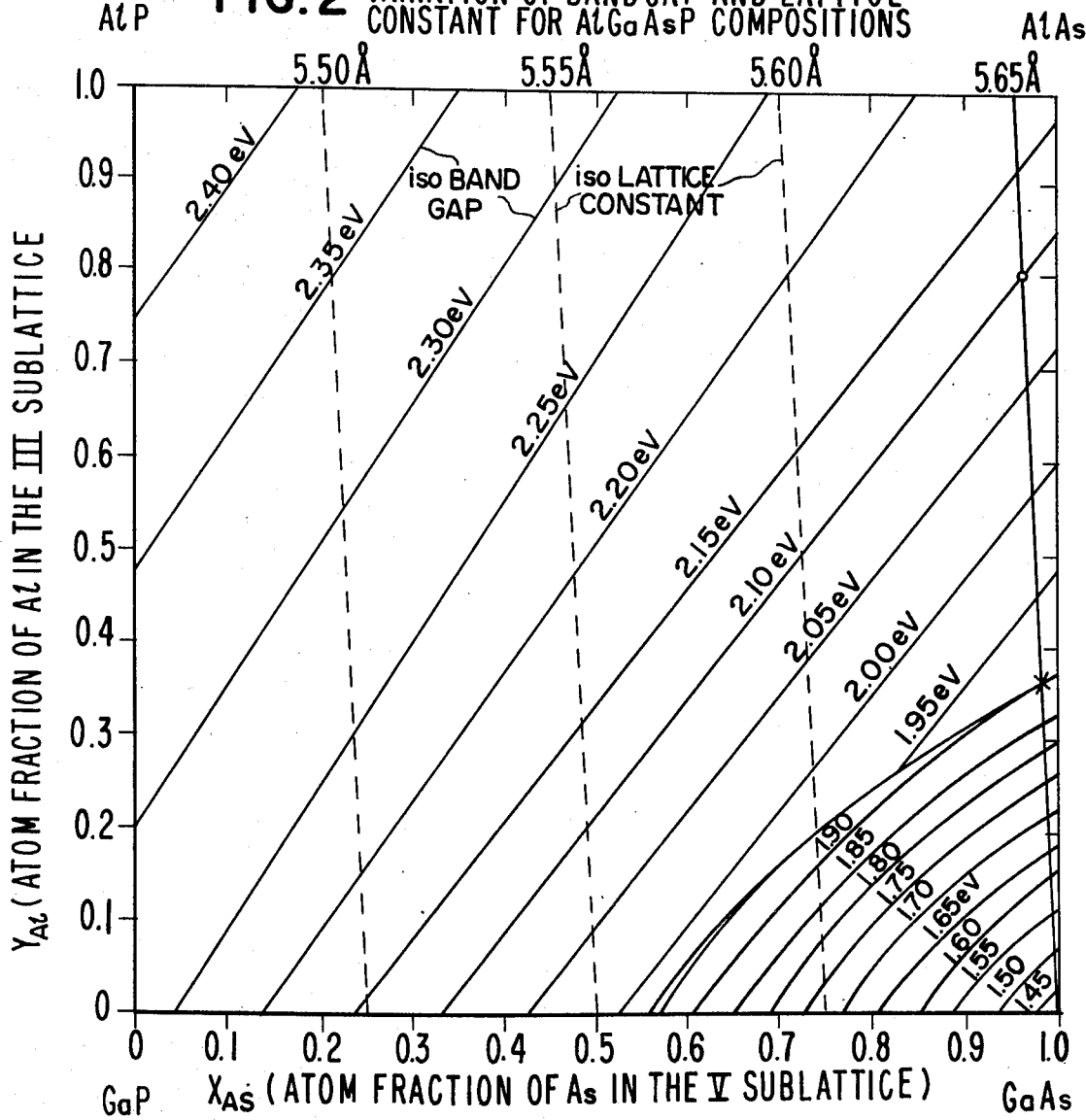
FIG.2 VARIATION OF BANDGAP AND LATTICE CONSTANT FOR AlGaAsP COMPOSITIONS

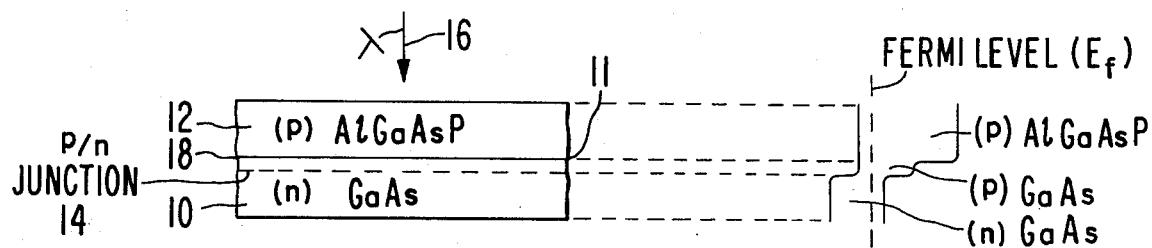
FIG.3 AlGaAsP$_{(p)}$/GaAs$_{(n)}$ PV CELL SECTION

PHOTOVOLTAIC CELL EMPLOYING LATTICE MATCHED QUATERNARY PASSIVATING LAYER

FIELD OF INVENTION

This invention relates generally to photovoltaic cells and particularly to a photovoltaic cell employing a novel passivating layer which provides increased solar conversion efficiency.

PRIOR ART

Photovoltaic cells generally comprise a layer of semiconductive material having a bandgap (energy difference from the top of the valence band to the bottom of the conduction band) the same as or less than the corresponding energy of incoming photons which are to be converted to electrical energy. A rectifying (p-n) junction is formed adjacent the upper surface of the layer of semiconductive material in order that electrical carriers generated adjacent such surface by incoming photons may be captured before recombination so that they provide a potential difference across the layer which is capable of supplying electrical output energy. Ohmic contacts are usually provided on the upper and lower surfaces of the layer to provide a means of conducting current from the layer.

It has also been proposed to provide a window or passivating layer of semiconductive material overlying the aforedescribed active or photovoltaic conversion layer. One such window layer is disclosed in U.S. Pat. No. 3,675,026 to Woodall, infra. Woodall's passivating layer is formed of gallium-aluminum-arsenide (GaAlAs) and overlies an active layer of GaAs which has a p-n junction adjacent the surface thereof.

The passivating layer is generally grown epitaxially on the active layer and has a conductivity type opposite to that of the active layer so that during epitaxial growth, some of the dopant of the epitaxial passivating layer will diffuse into the active layer and thereby create the desired p-n junction just below the surface of the active layer.

Woodall also teaches that his passivating layer serves as a shield to prevent cosmic ray components in the solar radiation from causing radiation damage to the active layer and also provides a contact surface for the upper side of the active layer.

While Woodall's passivating layer improves performance by preventing cosmic radiation damage and by providing a convenient way to form the p-n junction in the active layer, the efficiency of this structure is limited. According to the present invention, such efficiency is greatly improved.

Accordingly one object of the present invention is to improve the efficiency of a photovoltaic cell employing a passivating layer. Other objects are to provide a unique, alternative passivating layer, to provide a solar cell having reduced surface recombination velocity, reduced lattice strain, and improved performance. Further objects and advantages of the invention will become apparent from a consideration of the ensuing description thereof.

REFERENCES

The following references teach various uses of the quaternary alloy AlGaAsP:
Burnham et al., 19 Appl. Phys. Ltrs. 25 (1971);
Burnham et al., 17 Appl. Phys. Ltrs. 455 (1970);
Kurata et al., U.S. Pat. No. 3,801,509;
Ilegems et al., 35 J. Phys. Chem. Solids 409 (1974);
Afromowitz et al. 45 J. Appl. Phys. 4738 (1974);
Rozgonyi et al., 24 Appl. Phys. Ltrs. 251 (1974).
Rozgonyi et al, 23 Appl. Phys. Ltrs. 533 (1973)

The following references are referred to in the present specification or are useful as background teachings:
Woodall, U.S. Pat. No. 3,675,026, 1972 Jul 4;
Kroemer, U.S. Pat. No. 3,309,553, 1967 Mar 14;
Moon, U.S. pat. appn. Ser. No. 588,266, filed 1975 Jun 19;
James, U.S. pat. appn. Ser. No. 553,850, filed 1975 Feb 27;
James/Moon, U.S. pat. appn. Ser. No. 616,691, filed 1975 Sept. 25;
S. M. Sze, Physics of Semiconductor Devices, J. Wiley, Interscience, (1969).

DRAWINGS

FIG. 1 shows a plot of the percentage of maximum available current yield at 1.7 eV photon energy v. percentage of lattice mismatch of a passivating layer for a photovoltaic cell;

FIG. 2 shows a plot of the variation of bandgap and lattice constant for various compositions in an Al-Ga-As-P system;

FIG. 3 shows a cross-sectional view and associated energy band diagram of a photovoltaic cell according to the invention employing a GaAs active layer.

DESCRIPTION—DESIRABILITY OF LATTICE-MATCHED PASSIVATING LAYER

In photovoltaic cells employing a passivating layer as aforementioned, it has been discovered that their limited efficiency is due to the fact that not all of the carriers (electrons and holes) generated by incident photons do contribute to a useful electrical output current. Rather a substantial portion thereof recombine before they can reach the p-n junction. The reason for such recombination has been traced to the fact that the surface of the active layer contains many crystalline imperfections or incomplete crystalline lattice bonds (dangling bonds) which result because the lattice constant of the passivating layer differs from that of the active layer. Such dangling bonds or crystalline imperfections induce or cause carriers to recombine, whereby they give up their energy as heat and/or reemitted light and do not contribute to useful output current.

By assuming that the degree of surface recombination is related to the number of dangling bonds due to the lattice parameter disparity between the passivating and active layers, the yield of available carriers can be obtained from the solution to the transport equation, which describes the behavior of carriers (electrons and holes) in a solid by diffusion. See Sze, op cit.

Using this method, the plot of FIG. 1 has been calculated to show the percentage of maximum available current yield (charge carriers collected) v. the percentage of lattice mismatch between the passivating layer and the underlying activating layer, assuming that the incoming photons have an energy of 1.7 electron volts (eV), the active layer has a diffused junction which lies 1 micron below the surface, and the material has an average diffusion length of 1 micron. It can be seen that, at the left end of the graph, where a very small lattice mismatch (0.01 percent) exists, the percentage of maximum available yield is almost 100, whereas at a mismatch of 0.16 percent, which occurs when an AlGaAs layer is formed on GaAs, as in the aforementioned patent, the yield is only 80 percent of the maximum. At greater mismatches, the percentage of maximum available yield goes down still further, though at a lesser rate than initially.

By matching the lattice constant of the passivating layer to the underlying active layer, the number of crystalline imperfections or dangling bonds is greatly reduced or eliminated, whereby the number of possible sites which induce carrier recombinations is reduced, as a result of which more carriers are able to reach the rectifying junction and thereby provide useful output current.

USE OF LATTICE MATCHED PASSIVATING LAYER

According to the present invention, a photovoltaic cell employing an active layer of a IIIA–VA material, such as gallium arsenide, is provided with a latticed matched passivating layer of the quaternary alloy of AlGaAsP, whereby the junction between the active and passivating layers will have very few dangling bonds or crystalline imperfections, as a result of which very few sites of carrier recombination will exist. Thereby a substantially greater portion of carriers generated by incident photons will be able to reach the rectifying junction so as to provide increased output energy. Thus the photovoltaic conversion efficiency of the cell will be greatly increased.

The bandgap of the passivating layer should be as high as possible since the higher the bandgap, the greater the amount of solar radiation will be transmitted because a semiconductive layer is transparent to all electromagnetic radiation having quantum energies below its bandgap.

The bandgaps and lattice constants of all alloys in the Al-Ga-As-P system and their variations can be determined from the plot of FIG. 2.

The bottom abscissa presents variable fractions of As and complementary fractions of P in the GaAsP system, ranging from no As, i.e., gallium phosphide, at the left end, to a full atomic fraction of As (no P), i.e., gallium arsenide, at the right end.

The left ordinate indicates variable fractions of Al in the AlGaP system, ranging from no Al, i.e., gallium phosphide, at the bottom end, to a full atomic fraction of Al (no Ga), i.e., aluminum phosphide, at the top end.

The top abscissa represents variations of As from AlP (no As) through all variations of As in the alloy AlPAs to AlAs (no P), with the atomic fraction of As being indicated by the legend below the bottom abscissa.

The right ordinate represents variations of Al from GaAs (no Al) through all variations of Al in the alloy GaAlAs to AlAs (no Ga), the atomic fraction of Al being indicated by the legend adjacent the left ordinate.

All possible variations of the quaternary alloy AlGaAsP are indicated in the center portion of the chart. For example AlGaAsP with 50 percent subfractions of Al and As would be represented by a point in the very center of the chart.

The broken vertical lines, which are labeled "iso lattice constant" and slanted slightly to the left, indicate those alloy series having the same lattice constant; these are indicated by the legends at the top of the chart. The heavy vertical line at the right of the chart, which leads to the bottom right hand corner of the chart, indicates the alloy series having the lattice constant of gallium arsenide, 5.65 Angstroms. It can be determined that the lattice constant of pure aluminum arsenide (upper right corner of chart) is slightly greater than 5.65 A and that the lattice constant of the alloy AlAsP with a subfraction of As of about 95 percent is the same as that of GaAs, 5.65 A, as indicated by the intersection of the 5.65 A iso lattice constant line with the upper abscissa.

The right ordinate of the chart, which represents variations of the alloy AlGaAs, (except at the top and bottom abscissas) indicates that the lattice constant of AlGaAs increasingly differs from that of GaAs as more Al is substituted for Ga.

The solid straight and curved lines, which slant upwardly to the right, and are labeled "iso band gap" indicate those alloy series having the same bandgap. The bandgap of the alloy series represented by each line is indicated adjacent the line. It can be seen that the alloy series having a lattice constant of 5.65 A has bandgaps from about 1.425 eV to 2.17 eV.

As aforestated, it is desirable to have the bandgap of the passivating layer as high as possible so it will transmit as great a proportion as possible of the solar radiation. With a GaAs active layer and a GaAlAs passivating layer, it can be seen that by increasing the fraction of Al in the passivating layer, the bandgap thereof can be increased. However it will also be noted that as the bandgap is increased in this manner, the lattice constant grows progressively greater than that of GaAs, so that the efficiency of this system is inherently limited.

According to the invention, the above problem has been recognized and solved by forming the layer of the quaternary alloy AlGaAsP. Lattice mismatch can thereby be eliminated since the addition of phosphorous can cause the location of the passivating layer on the chart to move from the right ordinate (GaAlAs with lattice mismatch) to the 5.65 A iso lattice constant line for GaAs, representing a lattice match with GaAs.

Although it would be desirable to form the passivating layer of the compound indicated by the intersection of the 5.65 AlGaAs iso bandgap line with the top abscissa, i.e., a compound of AlAsP, in practice the passivating layer must contain some gallium in order to enable easy epitaxial growth to to occur and so that the layer will be chemically stable. Obviously the gallium content should be as small as possible in order to make the bandgap as high as possible.

In practice a compound consisting of $Al_{0.8}Ga_{0.2}As_{0.98}P_{0.02}$ whose approximate location is indicated by the circle on the 5.65 A iso lattice constant line, is presently thought to be optimum for use as a passivating layer on a GaAs active layer.

GaAs ACTIVE LAYER (FIG. 3)

FIG. 3 shows a cross section of the semiconductive elements of a photovoltaic cell according to the invention employing a GaAs layer 10 and an AlGaAsP passivating layer 12. To the right of this cross-section diagram is indicated a plot of the bandgaps of the respective portions of the cell.

The solar cell is preferably formed by growing gallium arsenide layer 10 epitaxially upon a monocrystalline substrate, e.g., of bulk gallium arsenide (not shown). Layer 10 is preferably doped with Sn so that it is n-type and has a resistivity of about $3 \times 10^{-3}$ ohm-cm and a concentration of about $6 \times 10^{17}$ dopant atoms per cubic centimeter (da/cc). Layer 10 should be about 10 microns thick and may be about 18 mm in diameter.

Over layer 10 a p-type layer 12 of AlGaAsP is grown epitaxially by liquid phase epitaxial growth and is doped with Zn or Mg to have a resistivity of about $3 \times 10^{-2}$ ohm-cm and a dopant concentration of about $1 \times 10^{18}$ da/cc. Layer 12 is typically about 2 microns thick.

As is well known, during epitaxial growth of layer 12 on layer 10, some of the p-type dopant atoms in layer 12 will diffuse into the surface of layer 10, thereby creating an opposite conductivity (p-n) junction 14 near the surface of layer 10, which now is the heterojunction 18 between layers 10 and 12. Using well known techniques, the growth temperatures and impurity concentrations are adjusted such that junction 14 is near to junction 18, preferably about 0.5 microns below junction 18.

As can be seen from the energy band diagram to the right of the cross sectional showing of FIG. 3, the portion of layer 10 below junction 14 is n-type, the portion above junction 14 is p-type, and of course the epitaxial passivating layer 12 of AlGaAsP is p-type.

Further details of the construction of the photovoltaic cells of the type indicated, including the substrate, support member, contacts, anti-reflection coating, etc., can be obtained from the aforecited copending application of James. Details of doping of layer 12 can be obtained from the present inventor's copending application, also aforecited. Details of the contact configuration suitable for providing low resistance ohmic contact to the surface of the device can be obtained from the aforecited copending application of the present inventor and James.

In operation, when photons 16 from a solar or other source shine on the surface of the device of FIG. 1, those having a lower energy than the bandgap of layer 12 will pass through layer 12 to the portion of layer 10 near junction 14, where they will create excess charge carriers (holes and electrons). Those of such charge carriers which reach junction 14 will create a photovoltaic potential across junction 14 and hence the entire device and thereby will be able to provide a useful output current.

According to the invention, since the lattice constant of layer 12 is directly matched to that of layer 10 as aforenoted, heterojunction 18 between layers 10 and 12 will be substantially free of lattice constant mismatches, whereby very few of the charge carriers generated in the upper portion of layer 10 will be induced to recombine at junction 18. Thereby a substantially greater percentage of charge carriers than in prior art cells will be able to reach layer 14 and will thereby be able to contribute to useful output current, thereby substantially increasing the efficiency of the device and overcoming the inherent limitation in efficiency of prior art cells, aforediscussed.

What is claimed is:
1. In a photovoltaic cell, an active layer of a gallium arsenide semiconductive material containing a p-n junction within one micron of its upper surface, and a passivating layer formed over said upper surface of said active layer, said passivating layer being a quaternary alloy of aluminum, gallium, arsenic and phosphorus with lattice constant matched to that of said active layer and having a bandgap substantially greater than that of said active layer.

2. The cell of claim 1 wherein said passivating layer is transparent to substantially all visible light.

3. The cell of claim 1 wherein said passivating layer is epitaxial with said active layer.

4. The cell of claim 1 wherein said alloy consists of approximately 0.8 atomic parts aluminum, 0.2 atomic parts gallium, 0.98 atomic parts arsenic and 0.02 atomic parts phosphorus.

5. The cell of claim 1 wherein said active layer is epitaxially disposed on a gallium arsenide monocrystalline substrate.

6. The cell of claim 1 wherein said active layer below said junction is n-type and said passivating layer is p-type.

7. The cell of claim 6 wherein said active layer is doped with tin.

8. The cell of claim 6 wherein said passivating layer is doped with zinc.

9. The cell of claim 6 wherein said passivating layer is doped with magnesium.

10. The cell of claim 6 wherein the portion of said active layer above said junction is doped with the same p-type dopant as said passivating layer.

* * * * *